United States Patent [19]

Sastri

[11] Patent Number: 4,556,607

[45] Date of Patent: Dec. 3, 1985

[54] SURFACE COATINGS AND SUBCOATS

[76] Inventor: Suri A. Sastri, 20 Bicentennial Dr., Lexington, Mass. 02173

[21] Appl. No.: 594,224

[22] Filed: Mar. 28, 1984

[51] Int. Cl.⁴ .......................... C23C 9/10; C23C 5/00; C09D 3/00
[52] U.S. Cl. ................................ 428/627; 106/286.4; 106/286.3; 420/442; 428/679; 148/425; 148/427; 148/442
[58] Field of Search ....................... 428/621, 627, 679; 420/436, 442, 435, 441, 580; 148/425, 427, 442

[56] References Cited

U.S. PATENT DOCUMENTS

| | | | |
|---|---|---|---|
| 3,837,894 | 9/1974 | Tucker | 428/679 |
| 4,013,487 | 3/1977 | Ramquist | 428/679 |
| 4,325,994 | 4/1982 | Kitashima | 428/679 |
| 4,381,943 | 5/1983 | Dickson et al. | 420/441 |
| 4,410,490 | 10/1983 | Ray | 420/436 |

FOREIGN PATENT DOCUMENTS 35889  5/1978  Japan .................................. 428/679

OTHER PUBLICATIONS

The Journal of Metals, Mar. 1980, pp. 6 to 12, by A. J. Hickel.
The Transactions of the American Society of Mechanical Engineers (Journal of Lubrication Technology), vol. 100, Jul. 1978, pp. 428 to 435 by W. L. Silence.

Primary Examiner—Theodore Morris

[57] ABSTRACT

Coatings are disclosed (a) which are useful by themselves to substantially improve the surface properties of substrates to which they are applied and (b) which are useful as subcoats to substantially improve the bonding of coatings of nitrides, carbides and borides of titanium, hafnium and zirconium to such substrates. The coatings which are disclosed are novel materials characterized by a microcrystalline, single-phase, solid solution structure comprising:

(a) about 20 to 70% by weight of at least one element from the group consisting of cobalt and nickel;
(b) about 8 to 35% by weight of chromium;
(c) about 3 to 20% by weight of at least one element from the group consisting of molybdenum and tungsten; and
(d) about 0.5 to 10% by weight of at least one element from the group consisting of carbon, nitrogen and boron.

30 Claims, 3 Drawing Figures

SURFACE COATINGS AND SUBCOATS

BRIEF SUMMARY OF INVENTION

The invention is concerned with novel metal coatings which are useful by themselves to substantially improve the surface properties of substrates or as subcoats to substantially improve the bonding and further improve the physical properties of coatings of nitrides, carbides and borides of titanium, hafnium and zirconium when they are applied to substrates.

BACKGROUND OF THE INVENTION

Many materials such as ferrous metals, e.g., carbon steel; non-ferrous metals such as titanium, aluminum, beryllium, copper, etc.; ceramics and plastics would have a much broader range of usefulness if their surface properties such as hardness, wear resistance, corrosion resistance, etc., could be improved. In the past many types of surface coatings have been proposed for this purpose with varying degrees of success. In some instances the bonding of the coatings to these materials leaves something to be desired and in other instances desirable properties such as hardness are obtained at the expense of properties such as ductility. As examples of coatings which have been proposed mention may be made of nitrides, carbides and borides of titanium, hafnium and zirconium which have excellent hardness and corrosion resistance and have long been used to impart these properties to objects such as machine tools, cutting edges, valve parts, etc. Although such coatings have enhanced the use-life of such objects, inconsistent bonding and the porousness and discontinuity of the coatings have in some instances left something to be desired in terms of performance.

OBJECTS OF THE INVENTION

One object of the present invention is to provide novel coatings which can be applied to substrates to substantially improve the surface properties of such substrates.

Another object of the present invention is to provide novel coatings which are useful as subcoats in substantially improving the bonding and further improving the physical properties of coatings of nitrides, carbides and borides of titanium, hafnium and zirconium when they are applied to substrates.

Other objects of the invention should be clear from the drawings and the detailed description and claims which follow.

PRIOR ART

Figure 1:
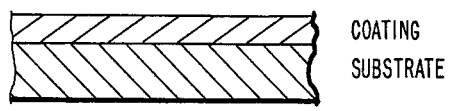
FIG. 1 is a cross-sectional view, with the thicknesses of the layers exaggerated, illustrating the coating of a substrate according to one embodiment of the invention.

Generally, alloys similar in composition to those of the novel coatings of this invention are known from publications such as (a) The Journal of Metals, March 1980, pages 6 to 12, by A. J. Hickel and (b) The Transactions of the American Society of Mechanical Engineers (Journal of Lubrication Technology), Vol. 100, July 1978, pages 428–435, by W. L. Silence. As set forth in such publications alloys of similar composition have long been used as hardfacing alloy, surface weld deposits for various substrates where degradation due to wear, high temperatures, corrosion and/or erosion must be avoided. Generally, such hardfacing alloy deposits are applied by oxyacetylene or gas tungsten arc welding techniques and are characterized by having a coarse-grain, two-phase structure comprising (1) a continuous, coarse-grained (typically in the order of 10 to 100 microns), face-centered-cubic, cobalt-based matrix phase and (2) a discontinuous, dispersed phase of metalloids, e.g., carbide particles which are typically about 1 to 10 microns in size. In the above and other known publications there is no disclosure of the novel coatings disclosed herein which are characterized by having a microcrystalline, single-phase, solid solution structure having the metalloids, i.e., the carbides, nitrides and borides dissolved therein; nor is there any disclosure of using suCh coatings as subcoats to substantially improve the bonding and physical properties of outer coatings of nitrides, carbides and borides of titanium, hafnium and zirconium.

DETAILED DESCRIPTION

In the present invention it has been found that the surface properties of various substrates may be substantially improved by the application of the coatings disclosed herein. It has also been found that such coatings are useful as subcoats to substantially improve the bonding and further improve the physical properties of coatings of nitrides, carbides and borides of titanium, hafnium and zirconium when such coatings are applied to substrates.

Generally, the composition of the novel coatings of the present invention comprises by weight:

(a) about 20 to 70% of at least 1 element from the group consisting of cobalt and nickel;
(b) about 8 to 35% of chromium;
(c) about 3 to 20% of at least 1 element from the group consisting of molybdenum and tungsten; and
(d) about 0.5% to 10% of at least 1 element from the group consisting of carbon, nitrogen and boron.

In preferred embodiments, cobalt is present in amounts of about 20 to 70% by weight of the composition and chromium is preferably present in amounts of about 15 to 35% by weight.

Generally, when tungsten is used alone, i.e., without molybdenum, in the novel coatings, it is preferably used in ranges of about 6 to 20% by weight and when molybdenum is used alone it is preferably present in amounts of about 3 to 10% by weight. When combinations of tungsten and molybdenum are employed, generally 1 part by weight of molybdenum will take the place of about 2 parts by weight of tungsten.

The novel coatings, as set forth above, comprise about 0.5 to 10% by weight of at least one element from the group consisting of carbon, nitrogen and boron. Generally, the preferred ranges for these elements are about 0.5 to about 8% by weight for carbon, about 0.5 to 10% by weight for nitrogen, and about 0.5 to about 8.5% by weight for boron. The especially preferred ranges for these elements are about 2 to 8% by weight for carbon, about 2 to 10% by weight for nitrogen and about 2.5 to about 8.5% by weight for boron.

When desired the novel coatings may also comprise iron and titanium and combinations of these elements. When such elements are used, best results are generally obtained when cobalt is present in amounts such that on an additive basis there is (a) at least 2 parts by weight of cobalt present for each part by weight of iron present; and (b) at least 3 parts by weight of cobalt for each part by weight of titanium present. For purposes of this invention the term, "on an additive basis," is intended to mean that if more than one of the elements of iron and titanium are used in combination with cobalt, the preferred amount of cobalt for best results is arrived at by adding the above specified preferred minimums for each element present, e.g., if the subcoat comprises equal parts by weight of iron and titanium, best results are generally obtained when at least 5 parts (2+3) by weight of cobalt are present.

The novel coatings, when desired, may comprise other elements to further enhance their properties such as 0 to 10% by weight of aluminum; 0 to 10% by weight of silicon; and 0 to 10% by weight of manganese.

Generally, the coatings of nitrides, carbides and borides of titanium, hafnium and zirconium, whose bonding to substrates is substantially improved by the novel coatings of this invention, are known, closely related compositions of matter formed from group IVB metals of the periodic table selected from titanium, hafnium and zirconium and a metalloid selected from the group consisting of carbon, nitrogen and boron. Generally, the outer coatings which are anchored by the novel coatings of this invention will comprise at least 50% and preferably at least 75% by weight of such carbides, nitrides and borides of titanium, hafnium and zirconium. When desired such outer coatings may comprise other substances to further enhance their properties or appearances such as, e.g., 0 to 25% by weight of niobium; 0 to 25% by weight of tantalum; 0 to 20% by weight of tungsten; 0 to 10% by weight of molybdenum; 0 to 20% by weight of nickel; 0 to 20% by weight of cobalt; 0 to 25% by weight of vanadium; and 0 to 5% by weight of metals from the platinum group. When adding vanadium care should be taken because of its known toxicity. The outer coatings, when desired, may be formed from combinations of different IVB metals and/or different metalloids, e.g., combinations of titanium nitride and hafnium nitride, combinations of titanium nitride and titanium carbide, and combinations of titanium nitride and zirconium carbide.

Both the novel coatings and the outer coats, i.e., the titanium nitrides, etc., are applied by well known physical vapor deposition coating processes. As examples of such processes mention may be made of sputter and ion plating coating processes and of vaporization processes utilizing electron beam, induction, resistance, or arc heating. The preferred methods for applying the novel coatings and the outer coatings are by sputtering and ion plating. Generally, such novel coatings and outer coats are applied by first cleaning the substrate and then applying the coatings by the particular method chosen. For example, in using sputtering the substrate may be first cleaned with a solvent and then further cleaned by bombarding it with, e.g., argon. The novel coatings and outer coats are then applied by successively using targets (and atmospheres) which will provide the desired composition. As is known ion plating would be carried out in a similar manner except that an electric potential would be imposed on the substrate to be coated. In employing vaporization processes utilizing electron beam, induction, resistance or arc heating, melts of the desired compositions for the novel coatings and outer coats are successively vaporized by such heating methods and deposited on the substrates. In using any of the above-mentioned coating processes the metalloids of carbon, nitrogen and boron may be incorporated into the coatings by having them present in the targets or melts, e.g., as carbides, nitrides or borides or by carrying out the coating processes in the presence of gases such as methane, nitrogen and diborane.

Figure 2:
FIG. 2 is a cross-sectional view, with the thicknesses of the layers exaggerated, illustrating a substrate coated according to another embodiment of this invention.

Referring to FIGS. 1 and 2 there are shown crosssectional views illustrating respectively the novel coatings used by themselves to improve the surface properties of a substrate (FIG. 1) and as subcoats to substantially improve the bonding of a coating of titanium nitride to the substrate (FIG. 2). As will be appreciated the thicknesses of the coatings have been exaggerated for purposes of illustration. Generally, the substrates can be comprised of just about any material such as ferrous metals; non-ferrous metals, such as tungsten carbides, titanium, aluminum, beryllium and copper; ceramics such as aluminum oxide, thermosetting plastics; and even thermoplastics when coating conditions are employed which will not heat them beyond their melting points. The novel coatings have been found especially useful as coatings by themselves or as subcoats for outer coatings when the substrate is a ferrous metal, e.g., stainless steels, surface oxidized steels, carbon steels, high speed steels, etc.

The novel coatings of this invention have also been found particularly useful by themselves or as subcoats when the substrate is titanium. Although titanium has excellent strength to weight ratios, even at moderately high temperatures, and good corrosion resistance, its usefulness has been somewhat limited by the fact that it becomes brittle when it is exposed to oxygen, nitrogen and/or hydrogen and that its galling tendency and wear resistance leave something to be desired. In the past, any attempt to overcome such deficiencies by adding a coating such as titanium nitride directly to its surface have not been too successful in that the nitrogen from the titanium nitride coating migrates into the metallic titanium and adversely affects its good properties. The novel coatings of this invention can be used by themselves or as subcoats for coatings such as titanium nitride to substantially improve the surface properties of titanium. In the latter use, i.e., as subcoats it has been found that the novel coatings substantially eliminate the migration of nitrogen into the metallic titanium.

The novel coatings have been further found to be particularly useful as coatings by themselves or as subcoats for outer coatings such as titanium nitride to substantially improve the wear resistance and reduce the tendency to gall of aluminum.

Although the substrates illustrated in FIGS. 1 and 2 are in the form of simple flat sheets, e.g., steel plates, they can be in the form of just about any object which would benefit from the application of such coatings, e.g., knives, commercial cutting edges, razor blades, punches, valve components, bearings, surgical instruments, wear plates, machine tools, watch casings, writing instruments, etc. The invention has been found especially useful in extending the use-life of cutting edges and machine tools of ferrous metals.

The novel coatings as applied by the physical vapor deposition coating processes are characterized by their microcrystalline, single-phase, solid solution structures in which the carbides, nitrides and borides are present as solutes. The microcrystallinity of the coatings is generally such that the average grain size is usually less than 2 microns and typically less than 1 micron. Having such characteristics, the coatings of this invention are substantially different materials than the known hardfacing alloy coatings which are characterized by their two-phase structures comprising (1) a coarse grained (typically between 10 to 100 microns), face-centered-cubic, cobalt-based, continuous phase and (2) a randomly dispersed second phase of carbide, boride, etc., particles which are generally between about 1 to 10 microns in size. Due to their distinct, microcrystalline, single-phase structures, the novel coatings of this invention form excellent, continuous, non-porous coatings which have excellent ductility, hardness, corrosion resistance and wear resistance. The combination of excellent ductility and hardness is noteworthy in that with the known hardfacing alloys it was believed that one had to be achieved at the expense of the other. The excellent wear resistance of the novel coatings, which as pointed out above do not contain particulate carbides, is also noteworthy in that with the hardfacing alloys it was generally believed that this property was directly proportional to the size of the particulate carbides. The excellent properties possessed by the coatings themselves indicates their use alone, i.e., without outer coatings, as novel coatings for substrates in which such properties are desired. In their use as subcoats for the outer coatings employed herein, it was found that such subcoats not only substantially improve the bonding of the outer coatings but that they also influence in a positive manner the physical properties of such outer coatings. In this regard, it was found that in addition to substantially improved bonding, the subcoats not only noticeably improve the continuity and non-porousness of the outer coatings (and thus consequently their corrosion and wear resistance), but they also impart improved ductility to the already excellent hardness of such outer coatings. The improved ductility, imparted by the subcoats, has made the outer coatings useful in many applications in which they will be subjected to bending, flexing, impaction, etc., where heretofore they were not considered to be too useful. It was found for example that by using the coatings disclosed herein as subcoats applying titanium nitride to strips of ferrous metal, the strips could be repeatedly bent to 180° and creased without causing delamination and/or fracture whereas without the subcoats this generally could not be done. As an illustration of the overall usefulness of this invention, it was found that commercial cutting edges of ferrous metal which were coated with titanium nitride coatings, using the coatings disclosed herein as subcoats, had about 40% to 100% improved use-lives as compared to cutting edges similarly coated but without the subcoats.

In addition to having excellent functional properties, e.g., wear resistance, etc., the novel coatings have excellent visual appeal which make them useful in applications where a decorative, wear-resistant coating is desirable such as costume jewelry, watch cases, writing instruments, etc. By modifying their composition the appearance of the coatings can be changed from a shiny, stainless steel-like appearance to a silver-like appearance and even to a platinum-like appearance. As an example of a coating composition having a platinum-like appearance, mention may be made of one comprising the following composition by weight: about 30% chromium, about 4% aluminum, about 2% silicon, about 3% nickel, about 3% titanium, about 16% tungsten, about 2% molybdenum, about 2% carbon, about 3% nitrogen and about 35% cobalt.

In an especially useful embodiment of the invention, nitrides, carbides and borides of titanium, hafnium and zirconium, which as pointed out above are the outer coatings, are incorporated directly into the novel coatings themselves. Such embodiments may be employed when the coatings are used to improve the bonding and physical properties of the outer coatings or when the coatings are used by themselves as surface coatings. In the latter use, it has been found that the incorporation of such nitrides, carbides, borides of titanium, etc., provides coatings which in addition to having the desirable properties mentioned above also had excellent erosion resistance which makes the coatings especially useful by themselves in end use in which they will come in contact with abrasive slurries, powders, etc. Generally, the coatings as modified in this embodiment will have incorporated therein from about 0 to about 80% by volume and more particularly from about 10% to about 80% by volume of the nitrides, carbides and borides of titanium, hafnium and zirconium. Preferably, the coatings as modified in this embodiment will have about 30 to 60% by volume of such nitrides, carbides, etc., incorporated therein. Especially useful results were obtained when about 50% by volume of such nitrides, carbides, etc., were incorporated. Although generally only one of the nitrides, carbides, etc., e.g., titanium nitride, will be incorporated into most coatings, it is contemplated that, when desired, combinations may be employed, e.g., titanium nitride and hafnium nitride may be added in combination. The modified coatings of this embodiment are applied in the same manner as specified above for the regular coatings, i.e., by physical vapor deposition processes such as sputtering and ion plating. The nitrides, carbides and borides of titanium, etc., may be incorporated into the coatings by adding them as such to the targets and melts or by adding the metals themselves, i.e., titanium, hafnium, and zirconium to the targets and melts and incorporating the metalloids by carrying out the coating processes in the presence of gases such as methane, nitrogen and diborane. When the nitrides, carbides, etc., are incorporated into the modified coatings they become dissolved therein and form with the other ingredients present a microcrystalline, single-phase, solid solution having average grain sizes similar to the unmodified subcoats, i.e., usually less than 2 microns and typically less than 1 micron. The modified coatings of this embodiment are novel in both composition and structure.

When the nitrides, carbides and borides of titanium, hafnium and zirconium are present as outer coatings, their compositions may also be modified to enhance their appearance. As an illustration of such modification titanium nitride which normally has a slightly bronze-like, gold appearance may be made to appear like 15 to 18K gold by adding about 7 to 10% by weight of niobium to its composition.

The thicknesses of the novel coatings may generally be varied depending on how they are to be used. When they are used by themselves as, e.g., wear-resistant and/or decorative coatings, good results may be obtained, for example, with thicknesses as low as 100 angstroms to 10 microns and beyond. As subcoats, the thicknesses may vary typically from, e.g., 500 angstroms to about, e.g., 10 microns. Preferably, thicknesses generally will lie between ½ to 10 microns.

The thicknesses of the outer coatings also may be varied depending on the purpose for which they are to be employed. Generally, they will range between, for example, about ½ to 100 microns and preferably between about 1 to 10 microns for most uses.

Figure 3:
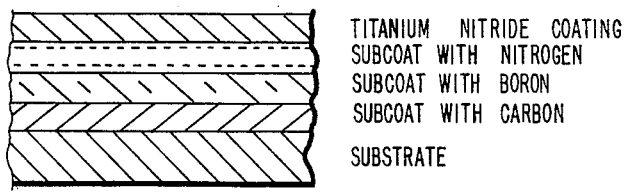
FIG. 3 is a cross-sectional view, with the thicknesses of the layers exaggerated, illustrating a substrate coated according to a further embodiment of this invention.

Referring to FIG. 3, there is illustrated an especially useful embodiment of the invention wherein a subcoat comprising a plurality of sublayers is employed. The sublayers have compositions which fall within the scope defined above for the novel coatings but have compositions which are specifically different from that of adjacent sublayers. As shown the subcoat includes (1) an inner sublayer comprising carbon which (inner sublayer) is adjacent to the substrate, (2) an intermediate sublayer comprising boron, and (3) an outer sublayer comprising nitrogen which is adjacent to the outer titanium nitride coating. Such embodiments can be produced, for example, (a) by employing distinct coating steps, e.g., using different targets, melts, and/or atmospheres to apply the different sublayers or (b) by merely gradually changing the atmosphere, e.g., from methane to borane to nitrogen, as the physical vapor deposition process is proceeding. As will be appreciated, in using the latter method, the line of demarcation between the different sublayers of the subcoat will not be as sharp as shown but that the composition will gradually change as the concentration of the gases change. Generally, the thicknesses of the different sublayers of the subcoats may vary and typically will range between, e.g., 500 to about 20,000 angstroms for the individual sublayers and, e.g., between about ½ to 10 microns for the combined subcoat. The use of such a plurality of sublayers is conducive to producing the best metallurgical bonds when, for example, one composition provides better bonding to the substrate and a second composition provides better bonding to the outer coating. Further the use of a plurality of sublayers of varying composition improves the modulus of elasticity of the subcoat and also further enhances the corrosion resistance by producing compositional discontinuities at the interfaces.

The following non-limiting examples further illustrate the present invention:

EXAMPLE 1

Industrial cutting blades of 1095 carbon steel were cleaned with a fluorocarbon solvent to remove any grease or oil on their surfaces and placed in a vacuum chamber containing a standard ion plating coating apparatus. The chamber was evacuated to $10^{-6}$ to $10^{-7}$ mm of Hg vacuum and the blades were ion bombarded using argon for about 5 minutes to further clean their surfaces. Using a target which would deposit an alloy containing by weight about 38% cobalt, about 2.5% nickel, about 5% titanium, about 28% chromium, about 2% silicon, about 2% aluminum, about 2% molybdenum, about 16% tungsten, about 1.5% iron and about 3% carbon the blades were coated by ion plating using argon to a thickness of 1 micron. Nitrogen was bled into the vacuum chamber and a second subcoat comprising the above alloy plus about 5% nitrogen was deposited to a thickness of about 1 micron. Using a titanium target in the presence of nitrogen the blades were coated by ion plating with a titanium nitride outer coating to a thickness of about 2 microns. The resulting titanium nitride coating was found to be extremely adherent and difficult to grind off even with silicon carbide abrasive paper. When the blades were bent back and forth at least 10 times to an extent which created a permanent crease, no signs of fracture or delamination of the coatings was observed. The use-lives of the blades were about 40 to 100% better than similar blades coated with titanium nitride but without the subcoat.

EXAMPLE 2

Drills composed of high speed steel were cleaned with a fluorocarbon solvent and placed in the vacuum chamber. The chamber was evacuated to about $10^{-6}$ mm of Hg and the drills were cleaned by bombardment with argon ions for about 7 minutes. Using a target which would provide an alloy containing by weight about 35% cobalt, about 7% nickel, about 1% iron, about 4% titanium, about 30% chromium, about 1% silicon, about 3% aluminum, about 10% molybdenum, about 5% tungsten, about 1% boron and about 3% carbon, the drills were coated by ion plating in an argon atmosphere to a thickness of about 1 micron. Nitrogen was bled into the chamber and in a mixed nitrogen-argon atmosphere the drills were further coated using the same alloy target to a thickness of about another micron. It is estimated that the second subcoat comprised about 4½% nitrogen. Using a titanium target and a nitrogen-argon atmosphere the drills were provided with an outer coat of titanium nitride to a thickness of about 2 microns. It was found that the multilayered coating was metallurgically bonded to the drills and they performed exceptionally well in metal drilling applications.

EXAMPLE 3

Ball valve parts of 316 stainless steel were cleaned with a fluorocarbon solvent and argon ion bombardment in a manner similar to that employed in Examples 1 and 2. Using a target which would provide an alloy containing by weight about 35% cobalt, about 30% nickel, about 4% iron, about 1% titanium, about 15% chromium, about 4% silicon, about 1% aluminum, about 4% molybdenum, about 2% tungsten, about 3% boron and 1% carbon, the parts were coated by ion plating in an argon atmosphere to a thickness of about 2 microns. Nitrogen was bled into the chamber and in a mixed nitrogen-argon atmosphere another 2 micron layer was applied. It was estimated that the second layer additionally contained about 2½% nitrogen. Using a nitrogen-argon atmosphere and a target which would provide an alloy containing by weight about 68% titanium, about 22% nitrogen (from atmosphere), about 5% niobium, about 2% molybdenum, about 2% nickel and about 1% paladium, the parts were provided with an outer coating of about 3 microns thickness. The thus coated valve parts exhibited excellent corrosion resistance, galling resistance and wear resistance when they were used in corrosive environments.

EXAMPLE 4

Tungsten carbide drills were first cleaned with fluorocarbon solvent and were cleaned again by argon bombardment for about seven minutes. In a nitrogen-argon atmosphere, a one-half micron thick subcoat comprising by weight 48% cobalt, 30% chromium, 12% tungsten, 1% silicon, 1.5% aluminum, 3% nickel, 2.5% carbon and 2% nitrogen was applied to the drills by ion plating. Using a titanium-hafnium target and a nitrogen-argon atmosphere, a 2 micron thick coating comprising about 80% by volume titanium nitride and 20% by volume hafnium nitride was applied to the previously subcoated drills by ion plating. The drills, thus coated, had a sparkling gold appearance and had use-lives which were 4 to 5 times longer than non-coated drills.

EXAMPLE 5

An impeller of cast 304 stainless steel which was intended for use in a pump for abrasive slurries and materials was cleaned with a fluorocarbon solvent and placed in a vacuum chamber which was evacuated to a pressure below about $10^{-6}$ mm of Hg. Argon gas was fed into the chamber until the pressure was about $20 \times 10^{-3}$ mm of Hg and the impeller was cleaned by ion bombardment for about 7 minutes. Using a nitrogen-argon atmosphere a 4 micron thick coating containing by weight about 28% cobalt, 24% titanium, 22% chromium, 14% tungsten, 2.5% carbon and the balance nitrogen was applied to the impeller by ion plating. The resulting coating could be expressed as containing about 50% by volume of titanium nitride, although the titanium nitride as actually present is dissolved in the coating and with the other materials present forms a microcrystalline, single-phase, solid solution structure. The impeller, thus coated, when used in a pump for abrasive materials was found to be about twice as effective in resisting erosion than a similar impeller coated with a conventional titanium nitride coating.

EXAMPLE 6

Titanium printer heads for high speed printers were cleaned in a fluorocarbon solvent and then were further cleaned in the vacuum chamber by ion bombardment with argon. A first subcoat of about 1 micron thickness and having a composition similar to that of the first subcoat used in Example 1 was applied by ion plating to the printer heads and then a second subcoat of about 1 micron thickness and having a composition similar to that of the second subcoat of Example 1 was applied by ion plating. An outer coating about 1 micron in thickness, comprising by weight 76% titanium, 20% nitrogen and 4% nickel, was then applied by ion plating. The printing heads, thus coated, showed a 70% reduction in wear and had use-lives which were about 200% better than uncoated heads.

EXAMPLE 7

Aluminum guide wheels for guiding moving wires were cleaned first with an alcoholic potassium hydroxide solution, then with a fluorocarbon solvent and finally by ion bombardment with argon for about 7 minutes. The wheels were then successively coated by ion plating with a first coating of about 5 microns thickness having a composition similar to the first subcoat applied in Example 1 and with a second coating of about 3 microns thickness having a composition similar to the second subcoat applied in Example 1. The guide wheels thus coated exhibited substantially better wear resistance when employed in their intended use.

Having thus disclosed the invention, what is claimed is:

1. A multilayer coating for a substrate, said coating comprising:
(A) a subcoat layer which is bonded to said substrate, said subcoat being characterized by having a microcrystalline, single-phase, solid solution structure and having a composition comprising:
 (a) about 20 to 70% by weight of at least 1 element from the group consisting of cobalt and nickel;
 (b) about 8 to 35% by weight of chromium;
 (c) about 3 to 20% by weight of at least one element from the group consisting of molybdenum and tungsten; and
 (d) about 0.5 to 10% by weight of at least one element from the group consisting of carbon, nitrogen and boron; and
(B) an outer coating layer bonded to said subcoat, said outer coating comprising at least 50% by weight of a material selected from the group consisting of nitrides, carbides and borides of titanium, hafnium and zirconium and combinations thereof.

2. A coating as defined in claim 1 wherein said outer coating comprises at least 75% by weight of said material.

3. A coating as defined in claim 1 wherein said composition of said subcoat comprises about 20 to 70% by weight of cobalt.

4. A coating as defined in claim 1 wherein said substrate is a ferrous metal.

5. A coating as defined in claim 3 wherein said substrate is a ferrous metal.

6. A coating as defined in claim 1 wherein said material of said outer coating is titanium nitride.

7. A coating as defined in claim 3 wherein said material of said outer coating is titanium nitride.

8. A coating as defined in claim 1 wherein said outer coating comprises about 0 to 25% by weight of niobium.

9. A coating as defined in claim 1 wherein said subcoat is composed of a plurality of sublayers of varying compositions, said varying compositions being within the scope of said composition for said subcoat as defined in claim 1.

10. A coating as defined in claim 7 wherein said substrate is a ferrous metal.

11. A coating as defined in claim 1 wherein said substrate is titanium.

12. A coating as defined in claim 1 wherein said substrate is tungsten carbide.

13. A coating as defined in claim 1 wherein said substrate is aluminum.

14. A coating as defined in claim 1 wherein said substrate is beryllium.

15. A coating as defined in claim 1 wherein said substrate is copper.

16. A coating for a substrate, said coating being characterized by having a microcrystalline, single-phase, solid solution structure and a composition comprising:
 (a) about 20 to 70% by weight of at least one element from the group consisting of cobalt and nickel;
 (b) about 8 to 35% by weight of chromium;
 (c) about 3 to 20% by weight of at least 1 element from the group consisting of molybdenum and tungsten; and
 (d) about 0.5 to 10% by weight of at least 1 element from the group consisting of carbon, nitrogen and boron.

17. A coating as defined in claim 16 wherein said composition comprises 20 to 70% by weight of cobalt.

18. A coating as defined in 16 wherein about 0 to 80% by volume of a material selected from the group consisting of nitrides, carbides and borides of titanium, hafnium and zirconium and combinations thereof is dissolved therein.

19. A coating as defined in claim 18 wherein said composition has dissolved therein about 30 to 60% by volume of said material.

20. A coating as defined in claim 18 wherein said material is titanium nitride.

21. A coating as defined in claim 19 wherein said material is titanium nitride.

22. A coating as defined in claim 16 having a platinum-like appearance, said composition comprising by weight about 30% chromium, about 4% aluminum, about 2% silicon, about 3% nickel, about 3% titanium, about 16% tungsten, about 2% molybdenum, about 2% carbon, about 3% nitrogen and about 35% cobalt.

23. A coating as defined in claim 18 which is bonded to an outer coating, said outer coating comprising at least 50% by weight of a material selected from the group consisting of nitrides, carbides and borides of titanium, hafnium and zirconium and combinations thereof.

24. A coating as defined in claim 16 wherein said substrate is a ferrous metal.

25. A coating as defined in claim 18 wherein said substrate is a ferrous metal.

26. A coating as defined in claim 16 wherein said substrate is titanium.

27. A coating as defined in claim 16 wherein said substrate is tungsten carbide.

28. A coating as defined in claim 16 wherein said substrate is aluminum.

29. A coating as defined in claim 16 wherein said substrate is beryllium.

30. A coating as defined in claim 16 wherein said substrate is copper.

* * * * *